United States Patent
Thallner

(10) Patent No.: US 9,682,539 B2
(45) Date of Patent: Jun. 20, 2017

(54) SUBSTRATE COMPOSITE, METHOD AND DEVICE FOR BONDING OF SUBSTRATES

(76) Inventor: Erich Thallner, St. Florian (AT)

( * ) Notice: Subject to any disclaimer, the term of this patent is extended or adjusted under 35 U.S.C. 154(b) by 13 days.

(21) Appl. No.: 14/417,898

(22) PCT Filed: Jul. 30, 2012

(86) PCT No.: PCT/EP2012/064851
§ 371 (c)(1),
(2), (4) Date: Jan. 28, 2015

(87) PCT Pub. No.: WO2014/019598
PCT Pub. Date: Feb. 6, 2014

(65) Prior Publication Data
US 2015/0202851 A1    Jul. 23, 2015

(51) Int. Cl.
H01L 21/00    (2006.01)
H01L 21/20    (2006.01)
(Continued)

(52) U.S. Cl.
CPC .......... *B32B 37/0076* (2013.01); *B32B 7/045* (2013.01); *B32B 37/18* (2013.01);
(Continued)

(58) Field of Classification Search
CPC ..... H01L 21/6835; H01L 24/05; H01L 24/08; H01L 24/16; H01L 24/29; H01L 24/32;
(Continued)

(56) References Cited

U.S. PATENT DOCUMENTS 4,966,646 A * 10/1990 Zdeblick ................... F15C 3/04
216/2
5,447,596 A 9/1995 Hayase ......................... 156/584
(Continued)

FOREIGN PATENT DOCUMENTS

CN    101925996 A    12/2010    ............. H01L 23/12
JP    10-31142    2/1998    ............... G02B 7/00
(Continued)

OTHER PUBLICATIONS

Office Action received in corresponding Japanese Patent Application No. 2015-524646 dated Jan. 20, 2016.
(Continued)

*Primary Examiner* — Seahvosh Nikmanesh
(74) *Attorney, Agent, or Firm* — Kusner & Jaffe

(57) ABSTRACT

A method for bonding a first substrate to a second substrate including the steps of: making contact of a first contact area of the first substrate with a second contact area of the second substrate, which second area is aligned parallel to the first contact area, as a result of which a common contact area is formed; and producing a bond interconnection between the first substrate and the second substrate outside the common contact area. The invention also relates to a corresponding device and a substrate composite of a first substrate and a second substrate, in which a first contact area of the first substrate with a second contact area of the second substrate, which second area is aligned parallel to the first contact area, forms a common contact area, outside the common contact area there being a bond interconnection between the first substrate and the second substrate.

14 Claims, 9 Drawing Sheets

(51) Int. Cl.
*B32B 37/00* (2006.01)
*H01L 23/00* (2006.01)
*H01L 21/683* (2006.01)
*H01L 25/00* (2006.01)
*B32B 7/04* (2006.01)
*B32B 37/18* (2006.01)
*H01L 23/10* (2006.01)
*H01L 25/065* (2006.01)
*H01L 23/498* (2006.01)
*H01L 23/544* (2006.01)

(52) U.S. Cl.
CPC .......... *H01L 21/6835* (2013.01); *H01L 24/05* (2013.01); *H01L 24/08* (2013.01); *H01L 24/16* (2013.01); *H01L 24/29* (2013.01); *H01L 24/32* (2013.01); *H01L 24/73* (2013.01); *H01L 24/75* (2013.01); *H01L 24/81* (2013.01); *H01L 24/83* (2013.01); *H01L 24/92* (2013.01); *H01L 24/94* (2013.01); *H01L 25/50* (2013.01); *B32B 2457/14* (2013.01); *H01L 23/10* (2013.01); *H01L 23/49827* (2013.01); *H01L 23/544* (2013.01); *H01L 24/13* (2013.01); *H01L 24/14* (2013.01); *H01L 24/27* (2013.01); *H01L 25/0657* (2013.01); *H01L 2221/6834* (2013.01); *H01L 2221/68318* (2013.01); *H01L 2221/68327* (2013.01); *H01L 2223/54426* (2013.01); *H01L 2223/54493* (2013.01); *H01L 2224/0401* (2013.01); *H01L 2224/04026* (2013.01); *H01L 2224/0556* (2013.01); *H01L 2224/05557* (2013.01); *H01L 2224/05558* (2013.01); *H01L 2224/131* (2013.01); *H01L 2224/14145* (2013.01); *H01L 2224/276* (2013.01); *H01L 2224/2902* (2013.01); *H01L 2224/29011* (2013.01); *H01L 2224/29014* (2013.01); *H01L 2224/2919* (2013.01); *H01L 2224/29187* (2013.01); *H01L 2224/32052* (2013.01); *H01L 2224/32055* (2013.01); *H01L 2224/32145* (2013.01); *H01L 2224/32502* (2013.01); *H01L 2224/32506* (2013.01); *H01L 2224/73104* (2013.01); *H01L 2224/73204* (2013.01); *H01L 2224/75251* (2013.01); *H01L 2224/75253* (2013.01); *H01L 2224/75822* (2013.01); *H01L 2224/75824* (2013.01); *H01L 2224/81143* (2013.01); *H01L 2224/81191* (2013.01); *H01L 2224/81801* (2013.01); *H01L 2224/831* (2013.01); *H01L 2224/832* (2013.01); *H01L 2224/8385* (2013.01); *H01L 2224/83193* (2013.01); *H01L 2224/83203* (2013.01); *H01L 2224/83801* (2013.01); *H01L 2224/92125* (2013.01); *H01L 2224/94* (2013.01); *H01L 2225/06568* (2013.01); *H01L 2924/00014* (2013.01); *H01L 2924/01322* (2013.01); *H01L 2924/10155* (2013.01); *H01L 2924/351* (2013.01); *Y10T 156/10* (2015.01); *Y10T 428/24826* (2015.01); *Y10T 428/24942* (2015.01)

(58) Field of Classification Search
CPC ......... H01L 24/80; H01L 24/75; H01L 24/81; H01L 24/83; H01L 24/92; H01L 24/94; H01L 25/50
See application file for complete search history.

(56) References Cited

U.S. PATENT DOCUMENTS

| | | | |
|---|---|---|---|
| 6,958,298 B2 | 10/2005 | Murayama | 438/759 |
| 7,410,908 B2 | 8/2008 | Hara | 438/745 |
| 7,566,632 B1* | 7/2009 | Rothwell | H01L 23/481 257/731 |
| 9,099,512 B2 | 8/2015 | Flaim et al. | H01L 21/6835 |
| 2004/0242003 A1 | 12/2004 | Murayama | 438/690 |
| 2006/0065972 A1 | 3/2006 | Khan et al. | 257/712 |
| 2008/0280420 A1* | 11/2008 | Yamazaki | H01L 21/02032 438/458 |
| 2009/0218560 A1 | 9/2009 | Flaim et al. | 257/9 |
| 2010/0255682 A1 | 10/2010 | Trickett et al. | 438/692 |
| 2011/0069467 A1 | 3/2011 | Flaim et al. | 361/807 |
| 2012/0190193 A1 | 7/2012 | Shau | 438/667 |
| 2012/0234887 A1* | 9/2012 | Henley | H01L 21/67092 225/1 |

FOREIGN PATENT DOCUMENTS

| | | | |
|---|---|---|---|
| JP | 2004-349649 | 12/2004 | B24B 7/22 |
| JP | 2007-005596 | 1/2007 | H01L 21/02 |
| JP | 2008-311459 | 12/2008 | H01L 21/60 |
| JP | 2011-023659 | 2/2011 | H01L 21/301 |
| JP | 2011-165761 | 8/2011 | H01L 21/60 |
| JP | 2012-079836 | 4/2012 | H01L 21/304 |
| TW | 200625570 | 7/2006 | H01L 23/34 |

OTHER PUBLICATIONS

International Search Report for International Application No. PCT/EP2012/064851, May 23, 2013.
First Office Action issued in related Chinese Patent Application No. 201280075065.1 dated Aug. 3, 2016 (with English-language translation).
Search Report issued in related Chinese Patent Application No. 201280075065.1 dated Jul. 26, 2016 (with English-language translation).

* cited by examiner

Fig. 1a
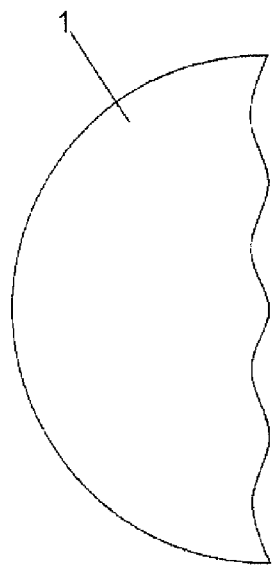
Fig. 1b
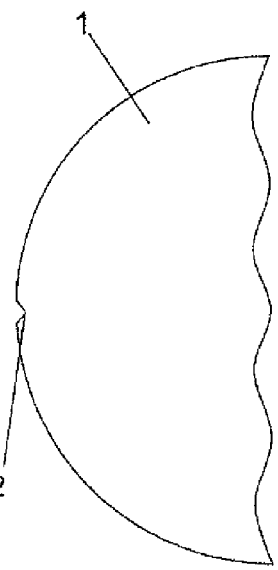
Fig. 1c
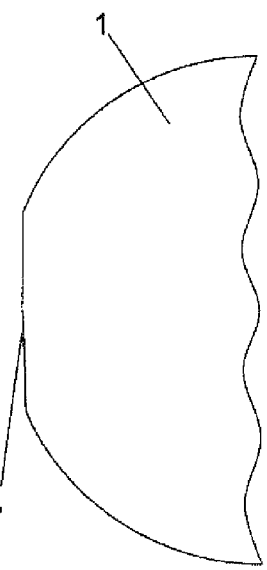
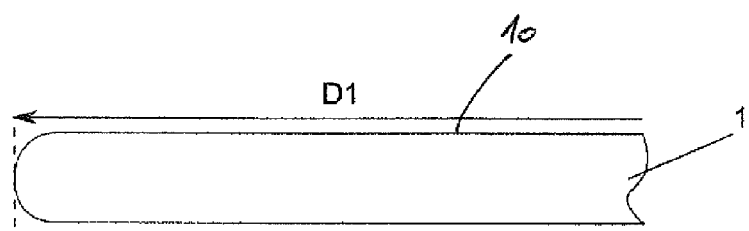
Fig. 2a
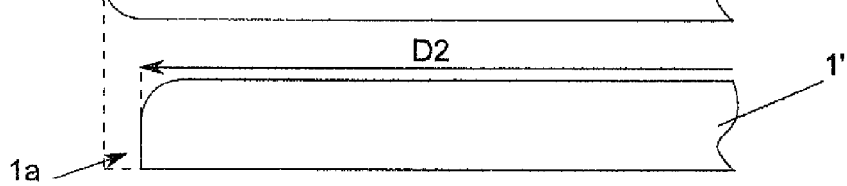
Fig. 2b

SUBSTRATE COMPOSITE, METHOD AND DEVICE FOR BONDING OF SUBSTRATES

FIELD OF THE INVENTION

This invention relates to a method for bonding of a first substrate to a second substrate and a corresponding device, as well as a substrate composite which has been produced especially according to the method and/or with the device.

BACKGROUND OF THE INVENTION

In the semiconductor industry carrier wafers with several hundred microns thickness are used to fix a product wafer by different processes. Fundamentally it is distinguished between the so-called permanent and temporary bonding methods.

In permanent bonding the carrier wafer and the product wafer are bonded to one another with the intention of no longer being separated from one another. Very often in this case the carrier wafers themselves are the product wafers which at this instant still have a corresponding thickness to act as a carrier to be functionally assigned to the product wafers. These permanent bond methods are diverse, very different and material-specific.

Moreover, it is very often necessary to connect the product wafer to a carrier wafer for a certain time interval in order to be able to carry out other process steps. Very often the product wafers in this temporarily bonded state are back-thinned and in this way reach thicknesses of less than 100 µm, generally less than 50 µm, at present around 20 µm, in the near future probably still less. The temporary fixing must be simple, fast to perform, cheap, efficient, reversible, and physically and chemically stable. Most often the carrier wafers are coated with a bonding adhesive and bonded in a bond method to the product wafer. The temporary bond which has been produced in this way is supposed to withstand high temperatures and forces. The bond interface is supposed to prevent the penetration of liquids and/or gases into the intermediate space of the carrier wafer and product wafer.

The most frequently used type of temporary bonding uses a bond adhesive layer. The adhesive layer can be applied over the entire area of the carrier wafer and/or of the product wafer. This layer has adhesive properties (undetachable interconnection) which are sufficient up to a certain temperature range to adequately fix the two substrates. For separation, the two substrates are heated above this temperature range and thus the cement loses the adhesive properties and these two wafers, the carrier wafer and the product wafer, are separated by application of a horizontal and a vertical force.

The adhesive layer can also be applied only on the edge of the product wafer and/or of the carrier wafer. The inner region does not necessarily contain an adhesive layer. The layer of the inner region can have any properties, but mostly is introduced as support means into the intermediate spaces of the individual bumps. The separation process is similar to the separation process of a blanket bond, in any case only the edge zones need be physically and chemically treated accordingly so that the temporary bond loses its adhesion. This is accompanied by lower temperatures, shorter process times and less material consumption of chemicals.

There are uncounted other methods for breaking a temporary bond again, for example by special lasers and by carrier wafers with small diameter holes through which a corresponding solvent is introduced into the bond over the entire surface.

SUMMARY OF THE INVENTION

The object of the invention is to devise a device and a method to cause on the one hand a high bond force between the substrates for all necessary process steps, on the other hand after processing of the substrate composite to enable nondestructive separation of the thin substrate from the substrate composite. In addition, the process steps which are necessary for this purpose are to be possible economically and universally for the most varied substrates/wafers.

This object is achieved with the features of the independent claim(s). Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination.

The invention describes a device and a method using which a carrier wafer can be temporarily and/or permanently connected to a product wafer. Furthermore the final product, a carrier wafer-product wafer composite (substrate composite) is described.

The invention is based on the idea that on the carrier wafer and/or the product wafer at several positions, preferably at at least three positions, there are specially produced interconnection elements which can be melted to one another and/or detached by physical and/or chemical processes. In particular mechanically moving parts for fixing are omitted.

The invention is based on the further idea of improving a generic device and a generic method such that the temporary bonding of two or more substrates is economically suitable (for all process requirements, also for high temperatures and a vacuum) and re-use in subsequent processes is enabled without expensive cleaning costs of the carrier wafer. Furthermore there are fixing agents which enable a suitable interconnection at high process temperatures and easy debonding.

The invention is based on the general inventive idea of producing a bond interconnection outside an active or common contact area between the substrates. Thus both mechanically movable fixing means and also exposure of the contact area between the substrates themselves are omitted, as a result of which the cleaning of the contact areas after breaking the interconnection is much simpler and more efficient. The substrates are available more promptly again for further processes or re-use. The active or common contact area is the area where, aside from possible coatings, there is direct contact between the first and the second substrate. Here it is especially advantageous if the interconnection is formed in spots over the area; this also comprises narrow circular ring-shaped application.

Substrates are defined as product substrates or carrier substrates which are used in the semiconductor industry. The carrier substrate is used as reinforcement of the function substrate (product substrate) for the different treatment steps, especially when back-thinning the function substrate. Substrates can be especially wafers, either flat or notched.

An independent invention is a substrate composite (or a product substrate-carrier substrate combination) which includes a carrier substrate and a product substrate which with the device and/or the method have been aligned, placed in contact and pre-fixed and/or bonded to one another and are characterized in particular in that the diameter D2 of the first substrate (carrier substrate) is minimally smaller than the diameter D3 of the second substrate (product substrate). Thus, it is ensured that the carrier substrate is not exposed to any contamination, fouling, unwanted treatment, etc. during the processing of the product substrate and therefore can be re-used more often.

According to another advantageous embodiment of the invention it is provided that the bond interconnection on the first substrate is at least partially, preferably largely formed on a first fixing area of the first substrate, which area is angled relative to the common contact area, and/or on the second substrate at least partially, preferably largely on a second fixing area of the second substrate which is angled relative to the common contact area. Thus optimum, space-saving transmission of force for fixing of the substrates (product substrate and carrier substrate) is possible. Angled means especially angles between 3 degrees and 90 degrees, preferably between 10 degrees and 90 degrees. In some especially advantageous embodiments the first and/or the second fixing area is located essentially orthogonally, especially exactly orthogonally, to the common contact area.

To the extent the first fixing areas and/or the second fixing areas are arranged rotationally symmetrical to one axis of rotation of the first substrate and/or the second substrate, the substrates are fixed on one another with an optimum distribution of the bond force.

According to another advantageous aspect of this invention, to form the bond interconnection, cements and/or especially metallic interconnection elements are used. The bond interconnection is used especially in addition for sealing of the common contact area relative to the vicinity.

According to another advantageous embodiment of the invention it is provided that a first area ratio between the first fixing area and the first contact area is less than 1:5, especially less than 1:10, still more preferably less than 1:20, and/or a second area ratio between the second fixing area and the second contact area is less than 1:5, especially less than 1:10, preferably less than 1:20. Thus the smallest possible space is expended for fixing so that more space remains for formation of structures on the product wafer.

Advantageously the second substrate, especially before the first and second contact areas make contact, is provided with an intermediate layer for leveling of bumps provided on the top of the second substrate. The intermediate layer is used to accommodate the bumps, the intermediate layer preferably not acting adhesively or in any case acting with low adhesion relative to the first substrate.

Moreover, this invention enables repeated use of the carrier substrate without its having to be cleaned by expensive and complex processes.

Moreover it is possible to integrate/install the device in a bonder.

To the extent features of the device are disclosed here or in the following description of figures, they are also intended to apply as disclosed as features of the method and vice versa. The same applies to the substrate composite.

Other advantages, features and details of the invention will become apparent from the following description of preferred exemplary embodiments and using the drawings.

BRIEF DESCRIPTION OF THE DRAWINGS

FIGS. 1a, 1b and 1c each show a schematic plan view of a first substrate with different outer contours before adaptation of a diameter D1 of the first substrate, FIG. 2a shows a schematic cross sectional view of the substrate according to FIG. 1a, FIG. 2b shows a schematic cross sectional view of the substrate after adapting (reducing) the diameter D1.

In the figures advantages and features of the invention are labeled with the reference numbers which identify them according to embodiments of the invention, components or features with the same function or function with the same effect being labeled with identical reference numbers.

DETAILED DESCRIPTION OF THE INVENTION

Figure 3A:
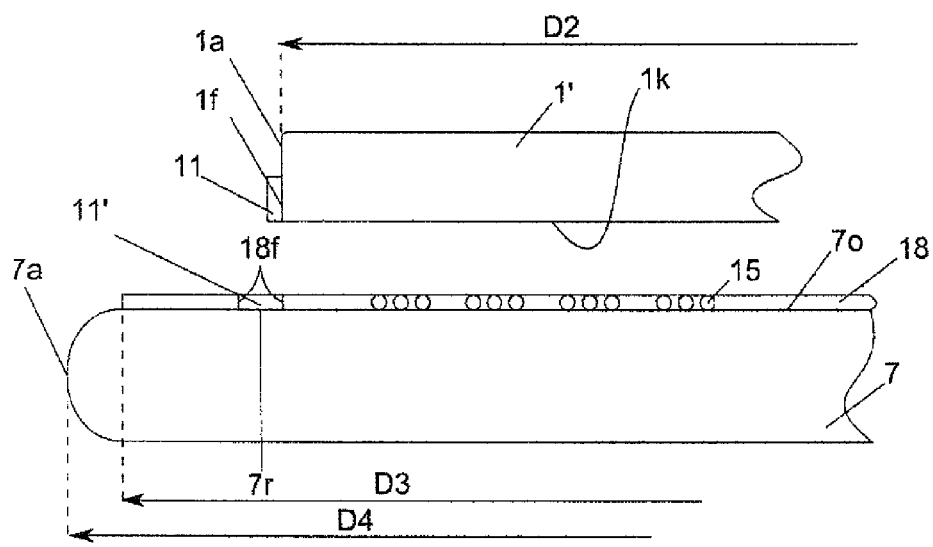
FIG. 3a shows a schematic cross sectional view of the first substrate before making contact with a second substrate with interconnection elements in a first embodiment.

For the generic method the first substrate 1 will be a carrier wafer of any material, but preferably of silicon. A second substrate 7 (product wafer), which is to make contact with the first substrate 1, and the carrier wafer is preferably comprised of the same material. Due to identical or at least similar materials mechanical and thermal parameters between the product wafer and carrier wafer are the same or at least similar.

The second substrate 7 on its top 7o has bumps 15 which are used for electrical interconnection of chips. For leveling and pressure equalization, on the top 7o there is an intermediate layer 18 as a component of the second substrate 7 on which contact is made with the first substrate 1. Thus the first substrate 1 has a first contact area 1k and the second substrate 7 has a second contact area 18k. To the extent there are no bumps 15, the second substrate 7 can be brought directly into contact with the first substrate 1 without an intermediate layer 18, then the top 7o becoming the second contact area.

The substrates 1, 7 can either be completely radially symmetrical or can have a notch 2, a flat 3 or any other deviation from the radial symmetry (FIG. 1), otherwise however can likewise be made radially symmetrical. The substrates 1, 7 are especially congruent in shape, preferably essentially radially symmetrical (aside from the aforementioned features). Expressed otherwise or more in general, the substrates 1, 7 have corresponding outer contours 1a, 7a.

For the bond method the carrier wafer (first substrate 1) is worked, especially by grinding and/or etching processes, with an especially commercially conventional diameter D1 (FIG. 2a) to a diameter D2 (FIG. 2b which is less (preferably) than or equal to the diameter D3 of the product wafer 7.

In the ideal case at the transition of the outer contour 1a to the first contact area 1k a corner edge (with a radius of curvature which is much smaller relative to the opposing one or prior to the reduction of the diameter, especially in a ratio less than 1:5) is provided so that a lower segment of the first substrate 1 has a cylindrical outer contour (aside from possible features according to FIGS. 1b and 1c).

One important, especially original aspect of the invention relates to a metal alloy which with on the one hand an interconnection and optionally a sealing of the common contact area between the carrier wafer and product wafer are caused. This can take place by several embodiments of the invention according to the following description.

In a first embodiment (FIG. 3) on the outer contour 1a of the first substrate 1 an especially rotationally symmetrical peripheral section is metallized. Preferably it is a metallization 11 which covers the entire periphery of the outer contour 1a of the first substrate 1'. In this way preferably complete sealing which is also gas-tight and/or liquid-tight is achieved. In one special version metallizations 11 can also be applied in spots only at some sites of the periphery of the carrier wafer 1. Gas-tight or liquid-tight sealing is not produced in this way. In any case the later sealing can be strong enough to temporarily and/or permanently bond the two wafers to one another. The metallization 11 is fixed on a first fixing surface 1f on the first substrate.

Preferably the second substrate 7 is also provided with a metallization 11' on the top 7o (or on the side of the intermediate layer 18 pointing toward the first substrate 1) in a ring segment 7r which is located outside a common contact area 22 which is formed between the first and second contact area 1k, 18k when making contact.

The metallizations 11 of the first substrate 1 and the metallizations 11' of the second substrate 7 can be comprised of different materials. Preferably metals are used whose alloys form a eutectic. More preferably at least one of the two metallizations should be comprised of a metal with a melting point as low as possible. The melting point should be less than 500° C., preferably less than 400° C., more preferably less than 300° C., most preferably less than 200° C., most preferably of all less than 100° C. Furthermore the two metallizations 11 and 11' can be comprised of the same metal. This metal should preferably have a melting point as low as possible. Since due to the geometry of the embodiment pressurization of the metallizing regions 11 and 11' is not possible or is only possible to a highly limited degree, production of the metallization 11" takes place predominantly by thermal stress. Generally it is therefore preferably a welding or soldering process.

Figure 3B:
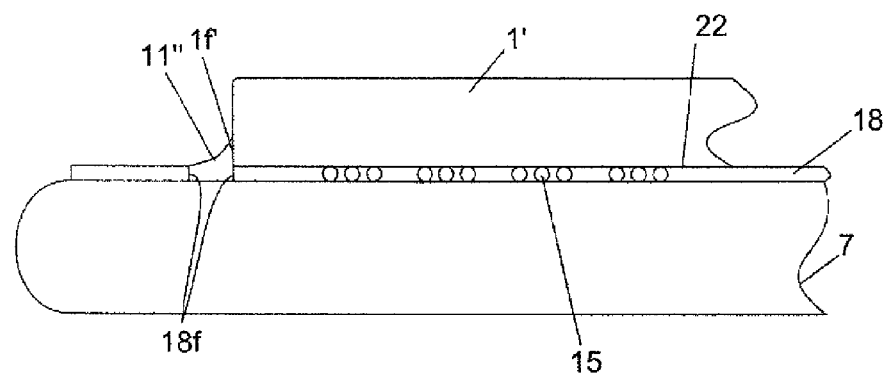
FIG. 3b shows a schematic cross sectional view of a substrate composite which has been produced according to FIG. 3a, FIG. 4a shows a schematic cross section view of the first substrate before making contact with a second substrate with interconnection elements in a second embodiment.

FIG. 3b shows the melted and re-hardened metallization 11" which is composed of the two metallizations 11, 11' (if present) and has a different shape due to the flowing during melting. The metallization 11" produces a bond interconnection between the first substrate 1 and the second substrate 7 and the intermediate layer 18 which belongs to the second substrate 7.

The bond interconnection exists toward the first substrate 1 on the outer contour 1a on one fixing area 1f' which is roughly orthogonally angled relative to the common contact area 22. Thus the bond interconnection is located outside the common contact area 22. Preferably the fixing surface 1f extends only over one part of the outer contour 1a.

Toward the second substrate 7 the bond interconnection is on the one hand provided on the ring segment 7r and on the other on a second fixing area 18f which is formed by a free space 30 of the intermediate layer 18, which free space is formed especially by the metallization 11'. The metallization 11' can be produced especially easily by lithographic processes. The second fixing surface 18f includes a peripheral wall which borders the free space 30. The ring segment 7r borders the free space 30 toward the second substrate 7 and thus forms a part of the second fixing area.

Figure 4A:
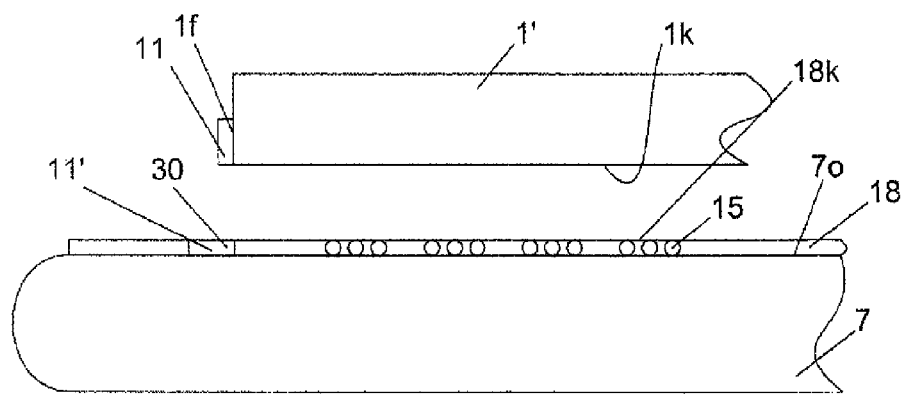
FIG. 4b shows a schematic cross sectional view of a substrate composite which has been produced according to FIG. 4a, FIG. 5a shows a schematic cross sectional view of the first substrate before making contact with a second substrate with interconnection elements in a third embodiment.
Figure 4B:
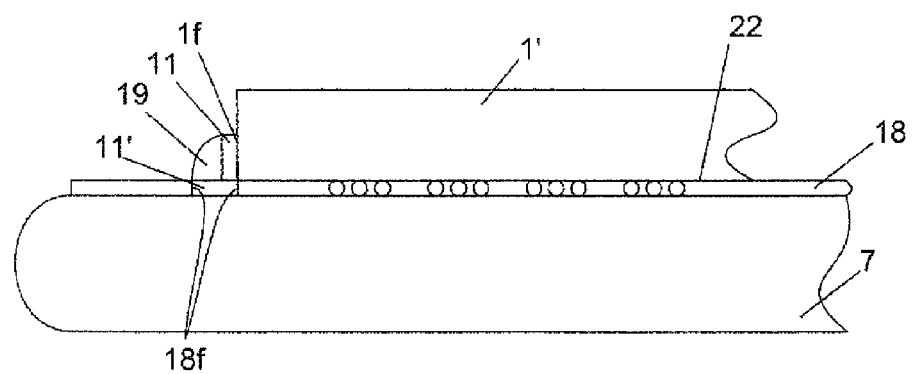

In a second embodiment which, aside from the following details, is made analogously to the first embodiment according to FIG. 3a/3b (FIG. 4), a material 19 is used to seal the two substrates 1, 7 along the outer contour 1a (on the entire periphery). Thus the common contact surface 22 is protected against fouling/contamination. The material 19 can be any type of adhesive or metal. The metallizations 11, especially together with a possible adhesiveness of the material 19, provide for sufficient bond force between the substrates 1, 7. According to the invention the metallizations 11, 11' can also be omitted, though.

Figure 5A:
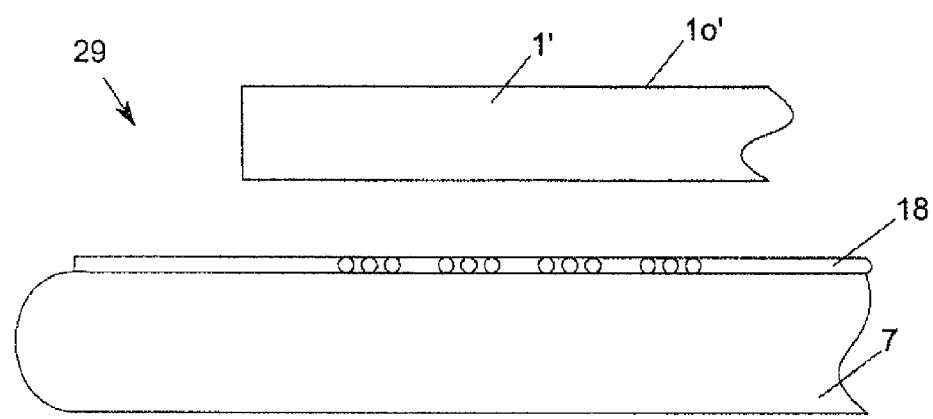
FIG. 5b shows a schematic cross sectional view of a substrate composite which has been produced according to FIG. 5a, FIG. 6a shows a schematic cross sectional view of the first substrate before making contact with a second substrate with interconnection elements in a fourth embodiment.
Figure 5B:
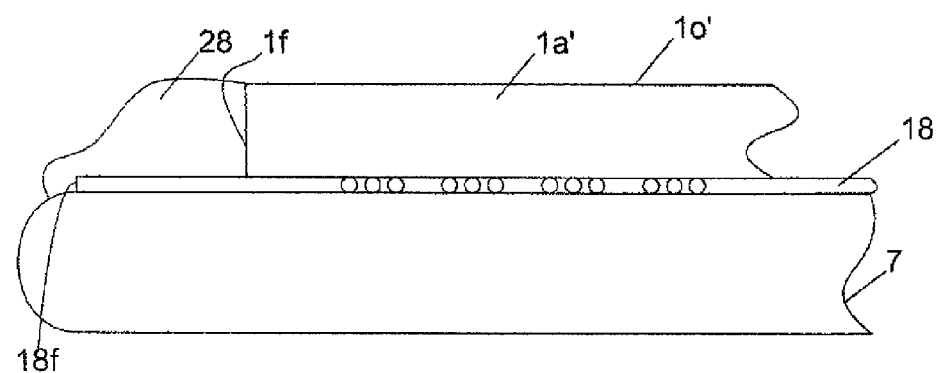

In a third embodiment (FIG. 5) the two substrates 1, 7 are bonded by a material superposition 28 which is produced in one process step. The material superposition 28 at least largely, preferably almost completely covers a ring segment 29 which projects over the first substrate 1 from the second substrate 7. The material superposition 28 is applied laterally on the first substrate 1' and over the second substrate 7 and after hardening, the first substrate 1 is fixed on the second substrate 7 by material superposition 28. This type of fixing will also preferably have a radially symmetrical shape. Preferably the material superposition 28 on the carrier wafer 1' is applied only laterally and on the product wafer 7 only on the edge surface. A slight covering of one top 1o' of the first substrate 1 would also be conceivable. The material superposition 28 is applied by application means, especially comprising a mask which allows access of the material which is to be applied only at the desired site. Vertical immersion of the two substrates 1, 7 into a melt and a rotation of the two substrates 1, 7 in the melt would also be conceivable. This immersion method referenced to the ring segment 29 allows wetting of the outer ring segment 29 which is to be protected. In one special embodiment the material superposition 28 is a metallization, but adhesives or ceramic materials would also be conceivable.

Figure 6A:
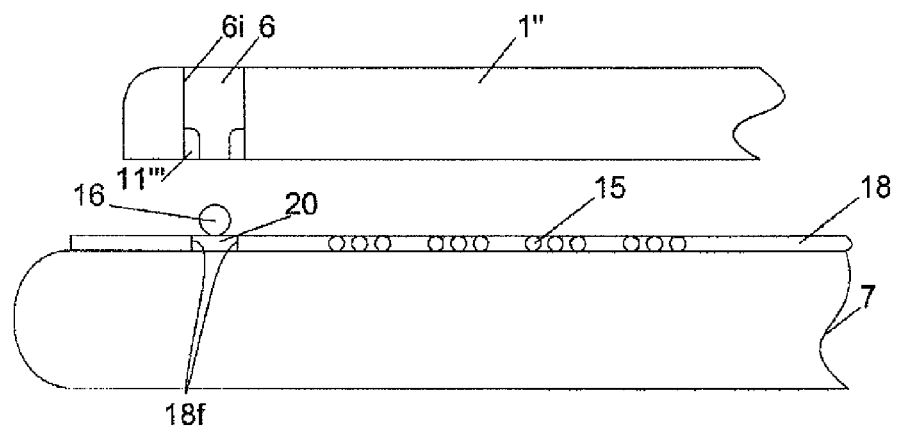
FIG. 6b shows a schematic cross sectional view of a substrate composite which has been produced according to FIG. 6a, FIG. 6c shows a schematic plan view according to cutting line A-A from FIG. 6b.
Figure 6B:
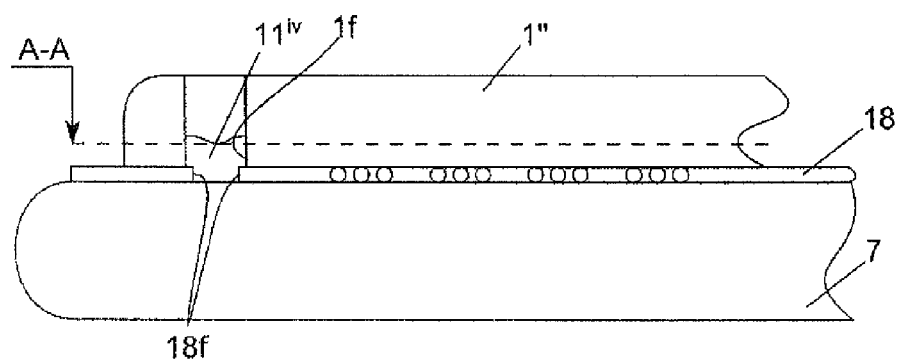
Figure 6C:
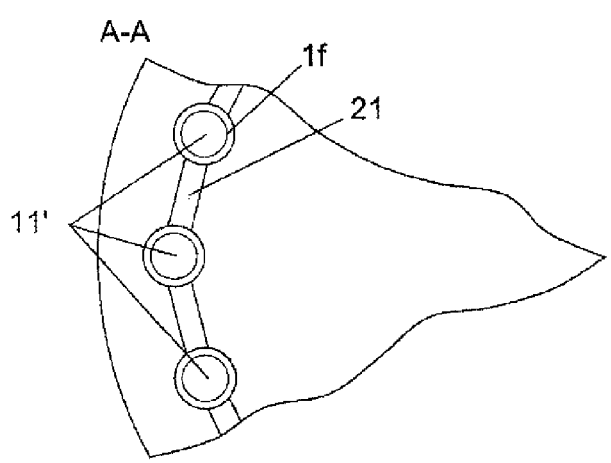

In a fourth embodiment (FIG. 6) holes 6 which pass especially through the first substrate 1" are drilled and/or etched into the first substrate 1". Preferably the holes 6 on their inner periphery 6i are provided with metallizations 11'" in order to enable a spot bond interconnection. On the product wafer 7 there are structures 16. Preferably the structures 16 are bumps. Depending on the shaping of the holes 6 and of the metallizations 11'" and the size of the structures 16 it is possible during the melting to enable self-adjustment at these points in the melting of the solder metal and the surface tensions which arise in doing so. In this type of fixing the substrates 1", 7 are directly interconnected to one another primarily at some few sites by material penetration into the holes 6. According to FIG. 6c the cured metallized interconnections $11^{IV}$ are fixings, especially between the metallizations $11^{IV}$ there being additional sealing elements 21 which are used for complete sealing of the common contact area 22 of the two substrates 1", 7. The sealing elements 21 can advantageously be linearly applied strips, preferably in the form of metallizations, which likewise weld to one another during thermal treatment. The welding takes place especially by thermocompression bonding and/or eutectic bonding.

Figure 7A:
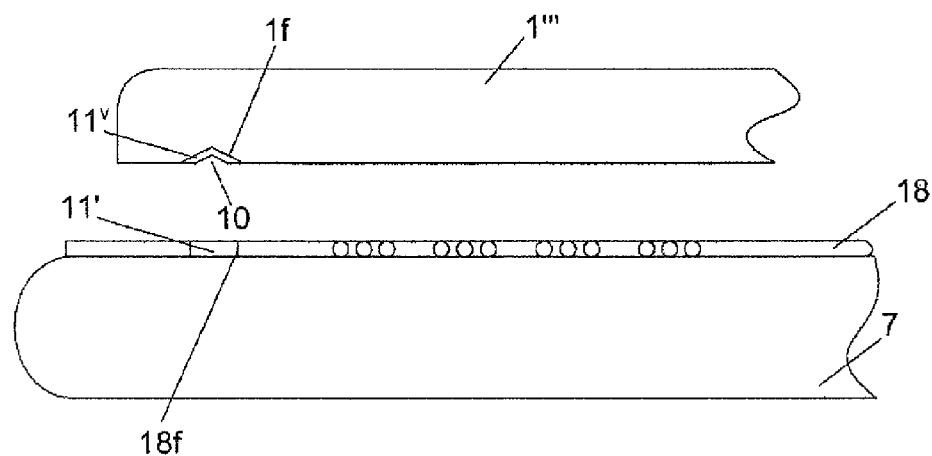
FIG. 7a shows a schematic cross sectional view of the first substrate before making contact with a second substrate with interconnection elements in a fifth embodiment.
Figure 7B:
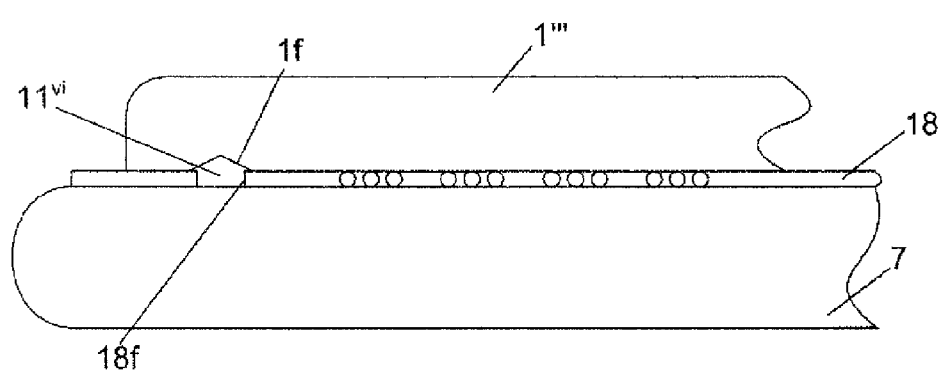
FIG. 7b shows a schematic cross sectional view of a substrate composite which has been produced according to FIG. 7a, FIG. 8a shows a schematic cross sectional view of the first substrate before making contact with a second substrate with interconnection elements in a sixth embodiment.

In a fifth embodiment (FIG. 7) cavities 10 of any shape on the contact side which encompasses the first contact area 1k are made in the first substrate 1'". Preferably the cavities 10 are provided with a metallization $11^V$, especially in spots. The cavities 10 are characterized by the holes 6 in FIG. 6 in that they do not completely penetrate the carrier wafer 1'", for this purpose can extend especially radially symmetrically as a closed ring around the entire wafer. Production of the cavities 10 by etching or milling would be conceivable. Mainly the crystallographic etching of carrier wafers of a certain crystallographic orientation can very efficiently produce cavities 10. Very efficient sealing of the interface between the two wafers is produced by the radial symmetry of the cavities 10.

Together with the metallization 11' (like FIG. 4a) the metallization $11^V$ is melted and cured as a metallization $11^{VI}$. The latter provides in turn for the bond interconnection between the substrates 1, 7.

Figure 8A:
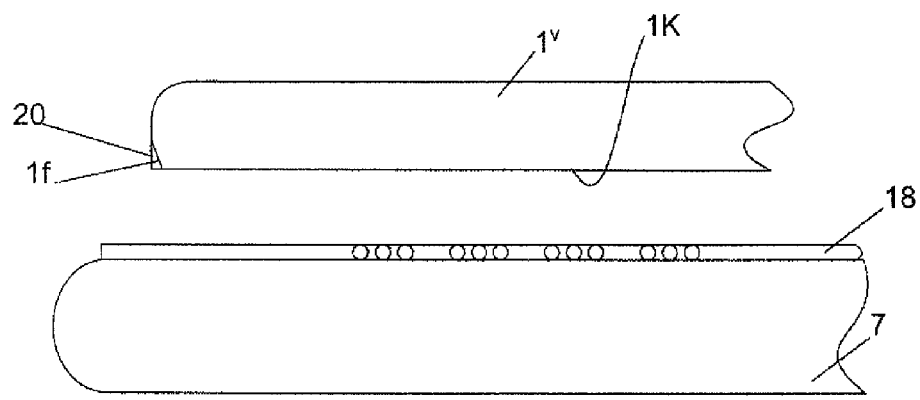
FIG. 8b shows a schematic cross sectional view of a substrate composite which has been produced according to FIG. 8a, FIG. 8c shows a schematic plan view according to cutting line B-B from FIG. 8b.
Figure 8B:
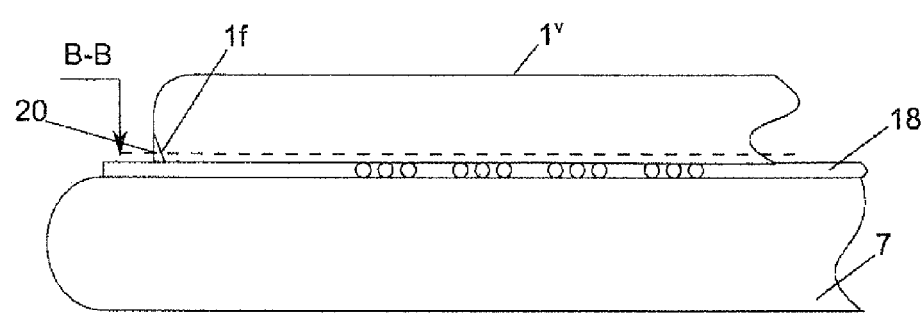
Figure 8C:
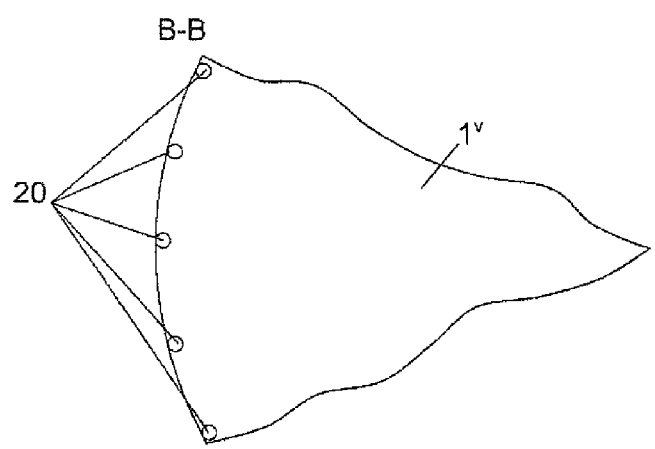

In a sixth embodiment (FIG. 8) small depressions 20 of any shape (especially as radially symmetrical, milled-out sites or bores) are made on the edge of the first substrate $1^V$. The interconnection between the first substrate $1^V$ and the second substrate 7 takes place with corresponding interconnection means, especially cements or metallizations.

Because the diameter D2 of the first substrate is less than/equal to the diameter D3 of the second substrate 7, the carrier wafer (first substrate 1) in subsequent processes, especially sputtering processes and plasma processes, is protected by the ring segment 29. A complex and expensive cleaning of the first substrate, especially caused by metallic contamination, is omitted. The first substrate can thus be re-used immediately for other/further steps.

Advantageously a nonadhesive or only slightly adhesive detachable sealing layer and/or separating layer is applied to the entire area of the first substrate 1 which comes into contact with the product wafer 7. The first substrate 1', 1", 1''', $1^{IV}$, $1^V$ which is provided with this sealing layer has no adhering, permanently cementing contact with the second substrate 7, except for the area of the solder points or adhesive points.

According to this new method of fixing the product wafer 7 to the carrier wafer 1' only at exactly defined points and of separating this fixing again after completion of the processes, any material which ensures fixing which is suitable for the process or processes can be used. In place of metallic solder also chemical or biological materials can be used which entirely or partially lose their fixing properties by adding other materials or energy.

The type of solder metal depends on the temperatures and requirements which are necessary in the other processes and is defined specifically to the process. Since the solder metals depending on the composition have a defined melting point, there is a wide possibility of temperature adaptation. The melting point is higher than the temperature contribution of the production processes which is to be expected at most.

But solder metals can also be used which are also used for the production of bumps on the product wafer. Since during unsoldering heat is supplied only at the sites which are intended for fixing, the bumps of the product wafer are not melted.

It is also possible, instead of the metallization 11, to apply any other material which enables fixing of the wafers. This material can have an adhesive and/or sealing action. The material can be applied radially symmetrically by an apparatus which is known in the semiconductor industry.

In all embodiments the temperature for melting of the interconnection material for bonding and/or debonding can be added in any conceivable manner. In particular introduction over the entire area, preferably by the contact of the carrier wafer and/or of the product wafer with a heating plate, would be conceivable. In one special and preferred embodiment the heat is added by a heating element 32 only at those positions in which the corresponding metallizations or fixings are present. The local heating has the decisive advantage that not the entire wafer is thermally loaded and thus possible structures which are already present on the product wafer are not thermally loaded or are at least loaded very little.

In the apparatus which is used for bonding, at the sites which have these cavities 10, after making contact, temperature is added to melt the solder metal so that soldering takes place at these points. Debonding takes place in the same way, by heating and subsequent mechanical separation of the wafers by the introduction of movement by means of actuating units of a device.

Should one of the metallizations 11, 11', 11" be melted again, preferably melting heat is added only in the immediate vicinity of the metallizations 11, 11', 11".

Figure 9A:
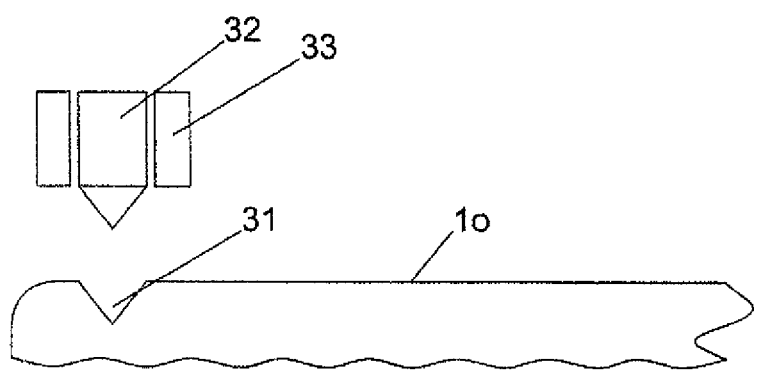
FIG. 9a shows a schematic cross sectional view of one surface of a substrate with a milled-in depression which runs around the substrate.
Figure 9B:
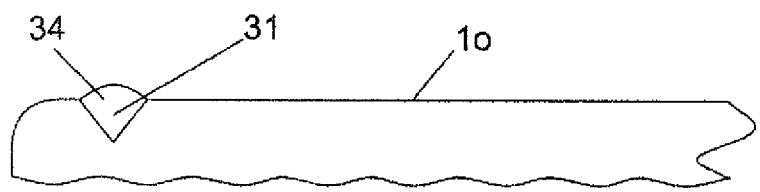
FIG. 9b shows a schematic cross sectional view of one surface of a substrate with a milled-in depression which runs around the substrate, and in which a metal has been deposited.
Figure 9C:
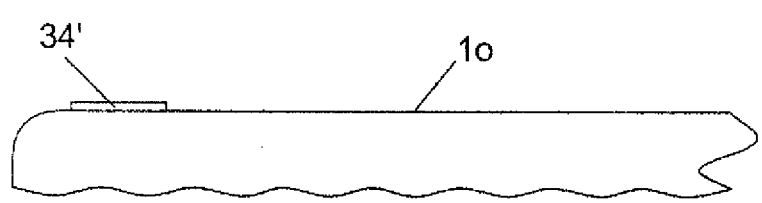
FIG. 9c shows a schematic cross sectional view of one surface of a substrate on which a metal has been deposited.

FIGS. 9a-9c show three possible embodiments for addition of melting heat locally over the surface to of the first substrate 1, independently of one of the embodiments shown. The addition can be used accordingly for any of the indicated embodiments and is herewith disclosed as an independent invention.

In a first embodiment preferably a very narrow heating element 32 is used which makes contact with the top 1o of the first substrate 1. Preferably the heating element 32 is surrounded by two cooling elements 33 which reduce the propagation of the heat over the entire first substrate 1. More preferably opposite (or on the side of the first substrate 1, 1' which faces away therefrom) the region of application of the metallizations 11, 11',11" in the first substrate 1, there is a depression 31 into which a heating element 32, in this case a heating element 32 with a wedge-shaped outline, can be inserted in order to optimize heat transport to the metallization 1.

In another embodiment, a metallization 34 is deposited in the depression 31 for heating, especially in conjunction with the heating element 32. Due to the metallization 34 a high current is routed which produces Joulean heat which in turn heats up the vicinity of the metallization 34 and thus leads to melting of the metallization 34 which is located in the vicinity (function of the heating element 32).

In another embodiment, a metallization 34', especially in conjunction with the heating element 32, is deposited flush on the top 10 of the first substrate 1, 1', therefore without recessing in the first substrate 1, 1'.

The three presented methods can also be used to add heat for soldering (producing the interconnection).

Figure 10A:
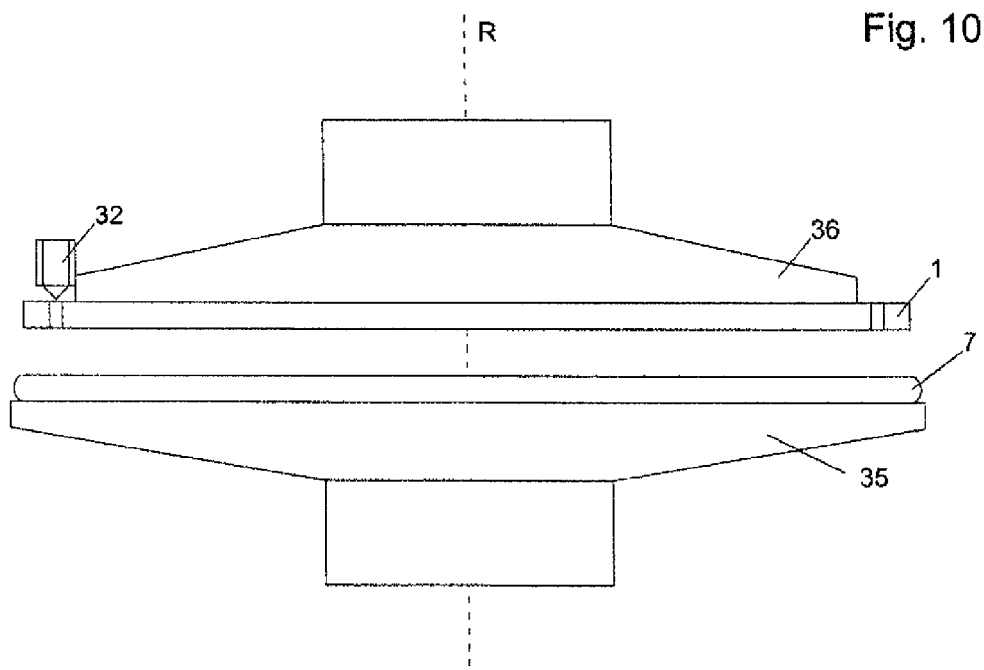
FIG. 10a shows a schematic cross sectional view of a device for local soldering and unsoldering.
Figure 10B:
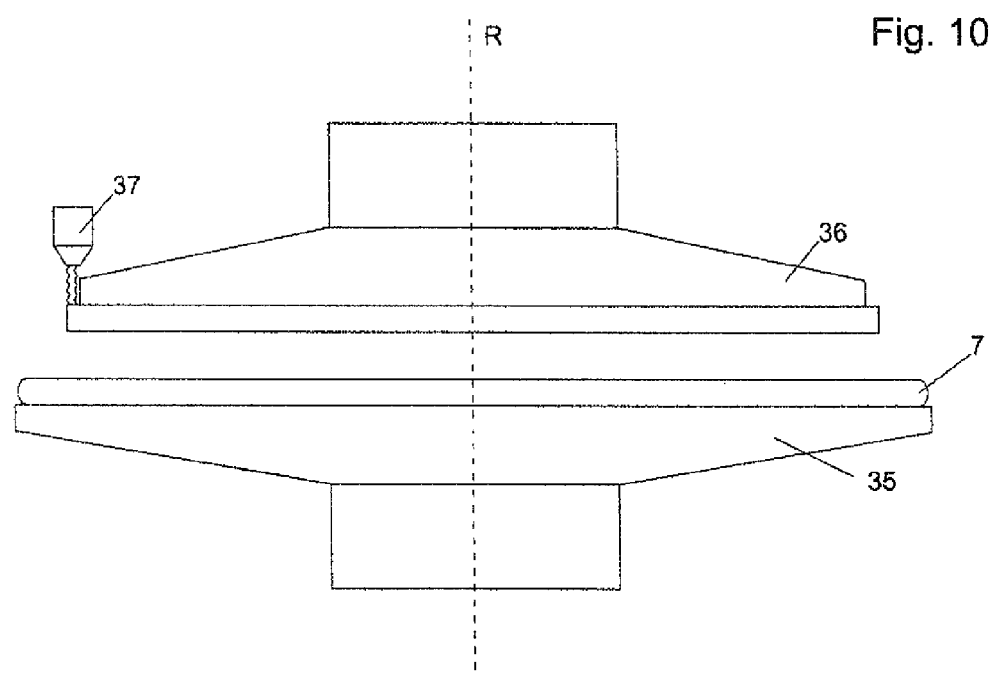
FIG. 10b shows a schematic cross sectional view of a device for local application of a material.

FIGS. 10a, 10b show a device comprised of at least one lower sample holder 35 and one upper sample holder 36. The upper sample holder 36 is made such that a heating element 32 can reach the edge of the substrates 1, 7 and make available the addition of heat for the soldering process and/or the unsoldering process. Between the upper and the lower sample holders 35, 36 preferably relative movement in all three directions of space is possible. Preferably the two sample holders 35, 36 can be turned to one another around an axis R of rotation. Even more preferably a relative movement of the heating element 32 between the two sample holders 35, 36 in all three directions of space is also possible. The sample holders 35, 36 are also called contact-making means for making contact of the first contact area 1k of the first substrate 1 with the second contact area 18k of the second substrate 7, which second area is aligned parallel to the first contact area 1k.

The sample holders 35 and 36 are preferably vacuum sample holders. But they can also be electrostatic or other sample holders which can fix the two wafers.

In another embodiment of the device, instead of a corresponding heating element 32, a dispensing unit 37 can be used. The dispensing unit can be used for lateral metallization, for deposition of adhesives, for application of sealing chemicals or for application of any material. As a result of the possible relative displacements and/or rotations of the sample holders 35, 36 to one another and/or the relative movement of the dispensing unit 37 relative of the sample holders 35, 36, a purely annular application or a blanket application of any material is possible. For example, prior to a bond process or soldering process on the outermost edge of the function wafer 7 or of the carrier wafer 1 a 500 μm to 2000 μm wide circular layer is applied in order to produce sealing in the edge region, especially for subsequent chemical processes. When using suitable flatness layers this application of an additional sealing layer in the edge region can be omitted. The backfilled flatness layer 18 between the bumps of the function layer must be removed in a cleaning step. Since to differentiate from other methods with adhesive layers this support layer has no adhesive properties or only the slightest such properties, cleaning is simpler and more economical than in adhesive methods.

REFERENCE NUMBER LIST 1, 1', 1", 1'" first substrate (carrier substrate)
$1^{IV}, 1^V$
1a first outer contour
1f first fixing area
1k first contact area
1o top
2 notch
3 flat
6 holes
6i inner periphery
7 second substrate (product substrate)
7a second outer contour
7r ring segment
7o top
10 cavities
11, 11', 11" metallizations
18 intermediate layer
18f second fixing area
18k second contact area
20 depressions
21 sealing elements
22 common contact area
28 material superposition
29 ring segment
30 free space
31 depression
32 heating element
33 cooling elements
34, 34' metal deposition
35 lower sample holder
36 upper sample holder
37 dispensing unit
D1, D2, D3, D4 diameter
R axis of rotation

The invention claimed is:

1. A method for bonding of a first substrate defined as a carrier wafer to a second substrate defined as a product wafer, said method comprising:
   directly contacting a first contact area of the first substrate with a second contact area of the second substrate to form a common contact area, said second contact area being aligned parallel to the first contact area, and
   producing a bond interconnection between the first substrate and the second substrate outside the common contact area,
   wherein the first substrate has a diameter D2 that is less than a diameter D3 of the second substrate.

2. The method as claimed in claim 1, wherein:
   the bond interconnection on the first substrate is at least partially formed on a first fixing area of the first substrate, which area is angled relative to the common contact area, and
   the bond interconnection on the second substrate is at least partially formed on a second fixing area of the second substrate, which area is angled relative to the common contact area.

3. The method as claimed in claim 2, wherein the first fixing areas and/or the second fixing areas are arranged rotationally symmetrical to one axis of rotation of the first substrate and/or the second substrate.

4. The method as claimed in claim 2, wherein a first area ratio between the first fixing area and the first contact area is less than 1:5 and/or a second area ratio between the second fixing area and the second contact area is less than 1:5.

5. The method as claimed in claim 2, wherein the bond interconnection is applied to the circumference of the carrier wafer.

6. The method as claimed in claim 5, wherein the bond interconnection is applied to only some portions of the circumference of the carrier wafer.

7. The method as claimed in claim 1, wherein adhesive and/or metallic interconnection elements are used to form the bond interconnection.

8. The method as claimed in claim 7, wherein the bond interconnection is produced at areas of the first and second substrate outside an outer circumference of the first substrate.

9. The method as claimed in claim 8, wherein the common contact area is within the outer circumference of the first substrate.

10. The method as claimed in claim 8, wherein a first interconnection element for the bond interconnection is formed on the outer circumference of the first substrate.

11. A method for bonding of a first substrate defined as a carrier wafer to a second substrate defined as a product wafer, said method comprising:
  providing an intermediate layer on a top surface of said second substrate to level bumps on the top surface, the intermediate layer being provided on the top surface as a component of said second substrate;
  directly contacting a first contact area of the first substrate with a second contact area of the intermediate layer of the second substrate to form a common contact area, said second contact area being aligned parallel to the first contact area; and
  producing a bond interconnection between the first substrate and the second substrate outside the common contact area,
  wherein the first substrate has a diameter D2 that is less than a diameter D3 of the second substrate.

12. The method as claimed in claim 11, wherein the bond interconnection is produced at areas of the first and second substrate outside an outer circumference of the first substrate.

13. The method as claimed in claim 12, wherein the common contact area is within the outer circumference of the first substrate.

14. The method as claimed in claim 12, wherein a first interconnection element for the bond interconnection is formed on the outer circumference of the first substrate.

* * * * *